US009214109B2

(12) United States Patent
Kwak

(10) Patent No.: US 9,214,109 B2
(45) Date of Patent: Dec. 15, 2015

(54) MOTHER SUBSTRATE OF ORGANIC LIGHT EMITTING DISPLAY DEVICE

(75) Inventor: Won Kyu Kwak, Seongnam-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 734 days.

(21) Appl. No.: 13/483,608

(22) Filed: May 30, 2012

(65) Prior Publication Data

US 2012/0235975 A1 Sep. 20, 2012

Related U.S. Application Data

(62) Division of application No. 11/882,052, filed on Jul. 30, 2007, now Pat. No. 8,217,676.

(30) Foreign Application Priority Data

Aug. 23, 2006 (KR) ............................ 2006-0079930

(51) Int. Cl.
*G09G 5/00* (2006.01)
*G01R 31/26* (2014.01)
*G09G 3/32* (2006.01)
*G09G 3/00* (2006.01)

(52) U.S. Cl.
CPC .............. *G09G 3/3266* (2013.01); *G09G 3/006* (2013.01); *G09G 2300/0842* (2013.01); *G09G 2300/0861* (2013.01); *G09G 2310/0251* (2013.01); *G09G 2310/0262* (2013.01); *G09G 2310/0289* (2013.01); *G09G 2320/0693* (2013.01)

(58) Field of Classification Search
CPC ............................ G09G 3/006; G09G 3/3266
See application file for complete search history.

(56) References Cited

U.S. PATENT DOCUMENTS

| | | | |
|---|---|---|---|
| 6,064,222 | A | 5/2000 | Morita et al. |
| 6,275,061 | B1 | 8/2001 | Tomita |
| 6,370,019 | B1 | 4/2002 | Matthies et al. |
| 6,476,783 | B2 | 11/2002 | Matthies et al. |
| 6,498,592 | B1 | 12/2002 | Matthies |
| 6,731,368 | B2 | 5/2004 | Yu et al. |
| 6,897,855 | B1 | 5/2005 | Matthies et al. |
| 7,015,509 | B2 | 3/2006 | Aruga |

(Continued)

FOREIGN PATENT DOCUMENTS

| | | | |
|---|---|---|---|
| EP | 1 843 318 | A2 | 10/2007 |
| JP | H01-130132 | A | 5/1989 |

(Continued)

OTHER PUBLICATIONS

Patent Gazette dated Oct. 11, 2012 of the Taiwanese Patent Application No. 096122411.

(Continued)

*Primary Examiner* — Jermele M Hollington
(74) *Attorney, Agent, or Firm* — Lee & Morse, P.C.

(57) ABSTRACT

An organic light emitting display device may include a plurality of pixels, a plurality of scan lines for selectively applying a scan signal to the pixels, a plurality of data lines crossing the scan lines for applying a data signal to the respective pixels, a scan driver for applying a scan signal to the scan lines, and at least one first testing unit electrically connected to the scan driver, wherein at least one output line of the first testing unit is electrically connected to the scan driver, and at least one other output line of the first testing unit is electrically disconnected and in an electrically open state.

15 Claims, 7 Drawing Sheets

(56) References Cited

U.S. PATENT DOCUMENTS

| | | | | |
|---|---|---|---|---|
| 7,106,283 | B2 | 9/2006 | Satoh | |
| 7,145,533 | B2 | 12/2006 | Imamura | |
| 7,518,602 | B2 | 4/2009 | Nozawa | |
| 7,649,585 | B2 | 1/2010 | Jeoung et al. | |
| 7,746,298 | B2 | 6/2010 | Shin | |
| 7,843,442 | B2 | 11/2010 | Choi et al. | |
| 7,855,700 | B2 | 12/2010 | Kim et al. | |
| 7,884,786 | B2 | 2/2011 | Kim et al. | |
| 7,915,070 | B2 | 3/2011 | Shin et al. | |
| 7,920,109 | B2 | 4/2011 | Chung | |
| 7,965,273 | B2 | 6/2011 | Lee et al. | |
| 7,995,011 | B2 | 8/2011 | Jeong et al. | |
| 2002/0093358 | A1 | 7/2002 | Kang | |
| 2004/0100428 | A1 | 5/2004 | Satoh | |
| 2004/0222814 | A1* | 11/2004 | Kim et al. | 324/770 |
| 2004/0246201 | A1 | 12/2004 | Sung et al. | |
| 2005/0012518 | A1 | 1/2005 | Lee | |
| 2005/0057273 | A1 | 3/2005 | Lin et al. | |
| 2005/0122297 | A1 | 6/2005 | Imagawa et al. | |
| 2005/0243267 | A1* | 11/2005 | Jeoung et al. | 349/187 |
| 2006/0001792 | A1 | 1/2006 | Choi | |
| 2006/0022969 | A1* | 2/2006 | Lee et al. | 345/211 |
| 2006/0060851 | A1 | 3/2006 | Kawata | |
| 2006/0061524 | A1* | 3/2006 | Suh et al. | 345/76 |
| 2006/0077144 | A1* | 4/2006 | Eom et al. | 345/82 |
| 2007/0001711 | A1 | 1/2007 | Kwak | |
| 2008/0054798 | A1 | 3/2008 | Jeong et al. | |
| 2008/0068309 | A1 | 3/2008 | Kwak et al. | |
| 2009/0033597 | A1* | 2/2009 | Sung et al. | 345/76 |
| 2009/0262051 | A1 | 10/2009 | Kim et al. | |
| 2009/0278835 | A1* | 11/2009 | Ka | 345/211 |
| 2011/0080173 | A1 | 4/2011 | Kim et al. | |
| 2011/0141097 | A1 | 6/2011 | Lee et al. | |
| 2014/0240521 | A1* | 8/2014 | Kwak | 348/189 |

FOREIGN PATENT DOCUMENTS

| | | | |
|---|---|---|---|
| JP | 10-097203 | A | 4/1998 |
| JP | 10-260391 | A | 9/1998 |
| JP | 2000-162571 | A | 6/2000 |
| JP | 2001-13187 | A | 1/2001 |
| JP | 2003-043980 | A | 2/2003 |
| JP | 2003-107136 | A | 4/2003 |
| JP | 2003-124276 | A | 4/2003 |
| JP | 2003-218178 | | 7/2003 |
| JP | 2003-271067 | A | 9/2003 |
| JP | 2003-324156 | A | 11/2003 |
| JP | 2004-515810 | T | 5/2004 |
| JP | 2005-091874 | A | 4/2005 |
| JP | 2005-093706 | A | 4/2005 |
| JP | 2005-331744 | A | 12/2005 |
| JP | 2006-189809 | A | 7/2006 |
| KR | 10-2002-0038877 | A | 5/2002 |
| KR | 10-2002-0041212 | A | 6/2002 |
| KR | 10-2003-0046801 | A | 6/2003 |
| KR | 10-2004-0028363 | A | 4/2004 |
| KR | 10-2004-0088211 | A | 10/2004 |
| KR | 10-2005-0064550 | A | 6/2005 |
| KR | 10-2005-0104786 | A | 11/2005 |
| KR | 10-2006-0057951 | A | 5/2006 |
| KR | 10-2007-0001583 | A | 1/2007 |
| TW | I220100 | B | 8/2004 |
| TW | I253608 | B | 4/2006 |
| WO | WO 02-47310 | A2 | 6/2002 |

OTHER PUBLICATIONS

Office Action dated Mar. 13, 2012 from JP 2010-048212 (patent family member of the present application).

English translation—JP 10-097203, filed Apr. 14, 1998.

European Office Action—EP Application No. 07 253 325.8—2205-13 dated Jul. 26, 2011.

Japanese Notice of Allowance dated Mar. 30, 2010

* cited by examiner

MOTHER SUBSTRATE OF ORGANIC LIGHT EMITTING DISPLAY DEVICE

CROSS REFERENCE TO RELATED APPLICATION

This is a divisional application based on application Ser. No. 11/882,052, filed Jul. 30, 2007, now U.S. Pat. No. 8,217,676, the entire contents of which is hereby incorporated by reference.

Cross-reference is made to U.S. application Ser. No. 11/882,051, filed Jul. 30, 2007, now U.S. Pat. No. 7,995,011 B2, issued Aug. 9, 2011, entitled "Organic Light Emitting Display Device and Mother Substrate of the Same"

BACKGROUND OF THE INVENTION

1. Field of the Invention

The present invention relates to a light emitting display device and a mother substrate of the same. More particularly, the present invention relates to a light emitting display device, e.g., an organic light emitting display device, capable of performing a sheet unit test on light emitting display devices on a mother substrate before scribing, independently controlling predetermined signals supplied to the respective light emitting display devices during the sheet test, and preventing and/or reducing damage to circuits for controlling the signals, and a mother substrate of the same.

2. Description of Related Art

Generally, a plurality of light emitting display devices, e.g., organic light emitting display devices, are formed on one mother substrate, and then scribed and separated into individual light emitting display devices. Tests on the light emitting display devices may be carried out on each of the scribed light emitting display devices.

A test on individual light emitting display devices may be carried out using an apparatus for testing each of the light emitting display devices. However, a test apparatus, or a jig required for testing may need to be changed if a circuit wire constituting the light emitting display device is changed, or if a size of the light emitting display device is varied. Also, the test time may be extended and the cost may be increased as the tests may need to be separately carried out on each of the light emitting display devices, which results in a reduced testing efficiency. Accordingly, it is desirable to carry out a test on a plurality of the light emitting display devices on a mother substrate prior to scribing the light emitting display devices.

Tests on normal light emitting display devices may not be suitably carried out if inferior or defective light emitting display device(s) are included on a mother substrate being subjected to a sheet unit test. Accordingly, in order to increase reliability and efficiency of the sheet unit test, predetermined signals supplied to selected ones of the light emitting display devices should be independently controlled by, e.g., turning off the inferior light emitting display device(s), so that the effect of the inferior light emitting display device(s) on tests of other light emitting display devices may be reduced or eliminated.

Also, the predetermined signals supplied to the selected ones of the organic light emitting display devices should be effectively controlled to reduce and/or prevent damage to circuits for controlling the signals.

SUMMARY OF THE INVENTION

The present invention is therefore directed to a light emitting display device and mother substrate thereof, which substantially overcome one or more of the problems due to the limitations and disadvantages of the related art.

It is therefore a feature of an embodiment of the present invention to provide a light emitting display device, e.g., an organic light emitting display device, capable of performing a sheet unit test on a plurality of light emitting display devices formed on a mother substrate, and a mother substrate of the same.

It is therefore a separate feature of an embodiment of the present invention to provide a light emitting display device, e.g., an organic light emitting display device, which may independently controlling the predetermined signals supplied to the respective light emitting display device for testing.

It is therefore a separate feature of an embodiment of the present invention to provide a light emitting display device, e.g., an organic light emitting display device that may prevent and/or reduce damage to circuits for controlling the signals in the test on at least one light emitting display device formed on a mother substrate, and a mother substrate of the same.

At least one of the above and other features and advantages of the present invention may be realized by providing an organic light emitting display device including a plurality of pixels, a plurality of scan lines for selectively applying a scan signal to the pixels, a plurality of data lines crossing the scan lines for applying a data signal to the respective pixels, a scan driver for applying a scan signal to the scan lines, and at least one first testing unit electrically connected to the scan driver, wherein at least one output line of the first testing unit is electrically connected to the scan driver, and at least one other output line of the first testing unit is electrically disconnected and in an electrically open state.

Each of the pixels may include an organic light emitting diode. The light emitting display device may include a pad unit for receiving a driving signal from the outside. The first testing unit may be electrically connected to the scan driver through the pad unit, and arranged in an edge region of the light emitting display device. The first testing unit may be arranged within a distance of about 300 μm from one side edge of the light emitting display device.

The first testing unit may include at least one logic gate. The logic gate may include at least one of a NOR gate, a buffer and an inverter. The inverter may be a tristate inverter. The light emitting display device may include a second testing/measuring unit arranged in an edge region of the light emitting display device. At least one output line of the second testing/measuring unit may be electrically connected to any one of a plurality of the scan lines, and at least one other output line of the second testing/measuring unit may be electrically disconnected and in an electrically open state.

The second testing/measuring unit may include at least one logic gate. The logic gate may include at least one inverter. The inverter may be a tristate inverter. The light emitting display device may include a transistor group having a plurality of transistors connected to respective first ends of the data lines. The data lines may be directly connected to the pixels.

The transistors provided in the transistor group may be maintained in a turned-off state to corresponding to a control signal supplied from the outside.

The light emitting display device may include a data driver for supplying a data signal to the data lines, and a data distributor connected between the data driver and respective second ends of the data lines to supply the data signals, supplied via at least one of output line of the data driver, to the plurality of the data lines.

The light emitting display device may include a supporting substrate and a sealing substrate, wherein the pixels are sandwiched between the supporting substrate and the sealing substrate. The light emitting display device may include a sealer formed between the supporting substrate and the sealing substrate, and formed outside of the pixels. The sealer may include at least one of a transition metal and a filler. The sealer may be a frit.

The sealing substrate may be arranged so as to keep the first testing unit exposed. The light emitting display device may include at least one of a first wire group extending in a first direction on a border region of the light emitting display device, and a second wire group extending in a second direction on the border.

Ends of the first and second wire groups may be electrically disconnected and maintained in an electrically open state.

At least one of the above and other features and advantages of the present invention may be separately realized by providing a mother substrate including a plurality of organic light emitting display devices, the mother substrate including a first wire group extending in a first direction on a border region of the light emitting display devices, and a second wire group extending in a second direction in the border region of the light emitting display devices, wherein each of the light emitting display devices includes a plurality of pixels, a plurality of scan lines for selectively applying a scan signal to the pixels, a plurality of data lines crossing the scan line and applying a data signal to the pixel, a scan driver for applying a scan signal to the scan lines, and at least one first testing unit connected between the scan driver and a predetermined wire included in the first or second wire group, wherein the scan driver generates a scan signal corresponding to a control signal supplied from the first testing unit, and power sources and signals supplied via the first or second wire group.

The first testing unit may be arranged between a first scribing line for separating the light emitting display devices and a second grinding line of the light emitting display devices. Each of the light emitting display devices may include a pad unit for receiving a driving signal, and the first testing unit is arranged between the pad unit and the first scribing line. The first testing unit may control the scan driver based on signals supplied from predetermined wires included in the first and second wire group.

The mother substrate may include a second testing/measuring unit connected between any one of a plurality of the scan lines and a predetermined wire included in the first or second wire group. The second testing/measuring unit may output an output signal to a predetermined wire included in the first or second wire group, the output signal corresponding to the scan signal supplied from the scan line connected to the second circuit unit itself, and the power sources and signals supplied from the first or second wire group.

The second testing/measuring circuit unit may be arranged within a distance about 300 μm from a first line for separating the light emitting display devices. The second testing/measuring unit may be arranged between a first scribing line and a second grinding line of the light emitting display devices.

The light emitting display devices may include a transistor group having a plurality of transistors connected between first respective ends of the data lines and a predetermined wire included in the first or second wire group. The transistors provided in the transistor group may be turned on at a same time to corresponding to a test control signal supplied from the first or second wire group. The transistor group may output a test signal, supplied from the first or second wire group, to the data lines corresponding to the test control signal

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
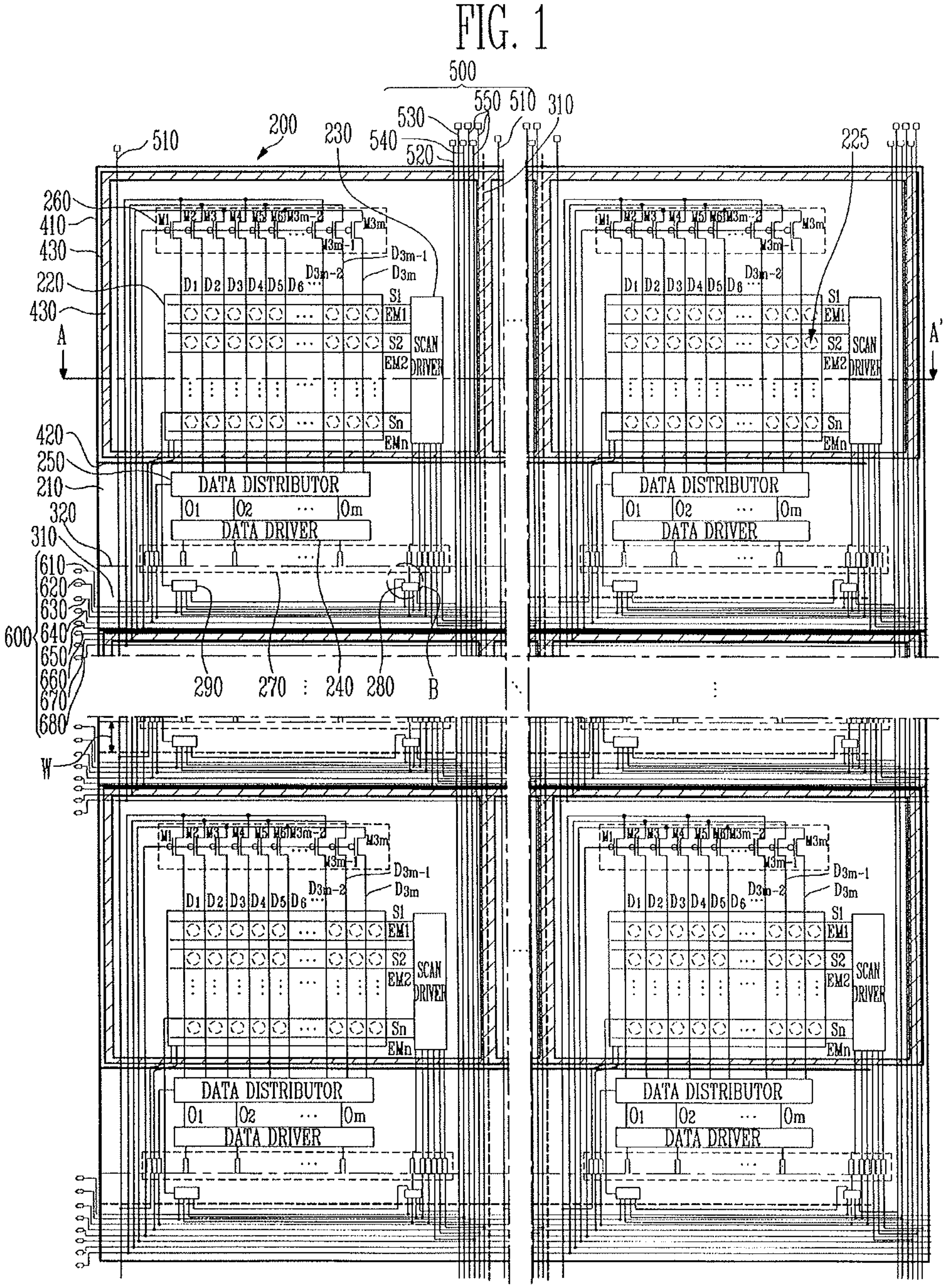
FIG. 1 illustrates a schematic diagram of an exemplary mother substrate of an organic light emitting display device according to one exemplary embodiment of the present invention.

Korean Patent Application No. 2006-0079930, filed on Aug. 23, 2006, in the Korean Intellectual Property Office, and entitled: "Organic Light Emitting Display Device and Mother Substrate of the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

Hereinafter, exemplary embodiments of the present invention will be described with reference to the accompanying drawings, as apparent to those skilled in the art. In the following description, when one element is connected to another element, one element may be not only directly connected to another element but also indirectly connected to another element via another element.

In the following description of exemplary embodiments, organic light emitting display devices may be employed as exemplary light emitting display devices. However, embodiments of the invention are not limited to organic light emitting display devices and one or more aspects of the invention may be applied to other light emitting display devices.

FIG. 1 illustrates a schematic diagram of an exemplary mother substrate of an organic light emitting display device according to one exemplary embodiment of the present invention.

Referring to FIG. 1, a mother substrate 200 of the organic light emitting display device according to the exemplary embodiment of the present invention may include a plurality of organic light emitting display devices 210 arranged in a matrix-like manner, first and second wire groups 500, 600 disposed in a border region of the organic light emitting display devices 210, and first and second circuit units 280, 290 disposed in a region between a scribing line (a first line) 310 and a grinding line (a second line) 320 of the organic light emitting display devices 210.

Each of the organic light emitting display devices 210 may include a pixel unit 220, a scan driver 230, a data driver 240, a data distributor 250, a transistor group 260 including a plurality of transistors (M1 to M3*m*), and a pad unit 270 for receiving a driving signal from the outside.

The pixel unit 220 may include a plurality of pixels 225, a plurality of scan lines (S1 to Sn) for selectively applying a scan signal to the pixels 225, a plurality of emission control lines (EM1 to EMn) for selectively applying an emission control signal to the pixels 225, and a plurality of data lines (D1 to D3*m*) arranged so as to be crossing the scan lines (S1 to Sn) and the emission control lines (EM1 to EMn) and applying a test signal or a data signal to the respective pixels 225. Each of the pixels 225 may include an organic light emitting diode.

The pixel unit 220 may display a predetermined image corresponding to voltages from first and second power sources ELVDD, ELVSS (not shown), scan signal(s) and emission control signal(s) from the scan driver 230, and test signal(s) from the transistor group 260. The voltages from first and second power source ELVDD, ELVSS may be supplied from a first wire 510 of the first wire group 500 and a fourteenth wire 640 of the second wire group 600, respectively, when the test(s) on the organic light emitting display device(s) on the mother substrate 200 is carried out. In some embodiments of the invention, depending on a configuration of the pixels 225 in the pixel unit 220, the pixel unit 220 may further receive additional voltages, e.g., a reset power source voltage Vinit.

After testing of the organic light emitting display devices 210 on the mother substrate 200 has been performed and/or the organic light emitting display devices 210 have been scribed, the pixel unit 220 may display a predetermined image corresponding to the data signal(s) supplied from the data distributor 250. That is, after testing of the organic light emitting display devices 230 on the mother substrate 200 has been performed and/or the organic light emitting display devices 210 have been scribed, the image(s) that may be displayed on the organic light emitting display devices 210 may not to correspond to the test signal(s) supplied from the transistor group 260, i.e., after scribing, the transistor group 260 may not supply signals for generating an image to the pixel unit 220.

The scan driver 230 may receive a voltage from a third power source VDD, a voltage fourth power source VSS and a scan control signal from a third wire 530, a fourth wire 540 and fifth wires 550 of the first wire group 500, and may receive a control signal from the first circuit unit 280 when the test(s) are carried out on the organic light emitting display device on the mother substrate 200.

The scan driver 230 may generate a scan signal and an emission control signal having a high level or a low level voltage corresponding to power source voltages and signals supplied to the scan driver 230 itself. The scan signal(s) and the emission control signal(s) generated by the scan driver 230 may be applied to the scan lines (S1 to Sn) and the emission control lines (EM1 to EMn), and then supplied to the pixel unit 220.

The scan driver 230 may generate a scan signal and an emission control signal corresponding to voltages of the third and fourth power sources VDD, VSS and a scan control signal (SCS) that may be supplied, through the pad unit 270, from an external printed circuit board after the organic light emitting display devices 210 on the mother substrate 200 are scribed.

Figure 2:
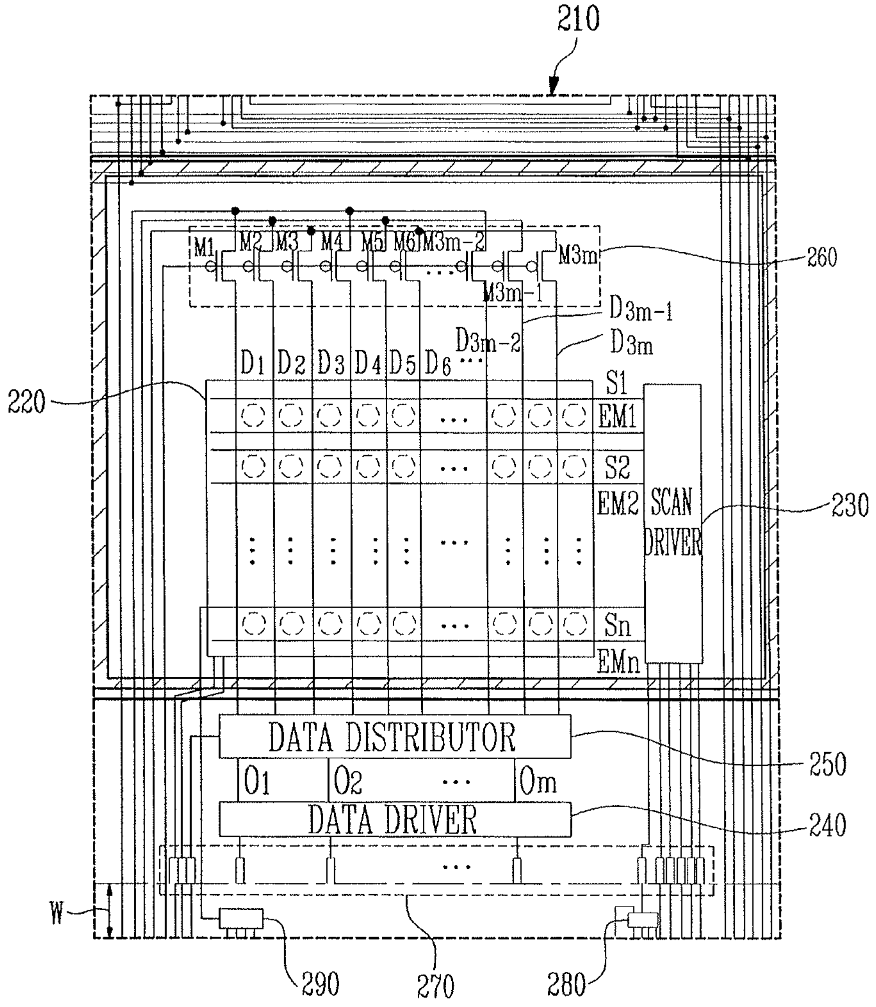
FIG. 2 illustrates a schematic diagram of one of the exemplary organic light emitting display devices shown in FIG. 1.
Figure 3:
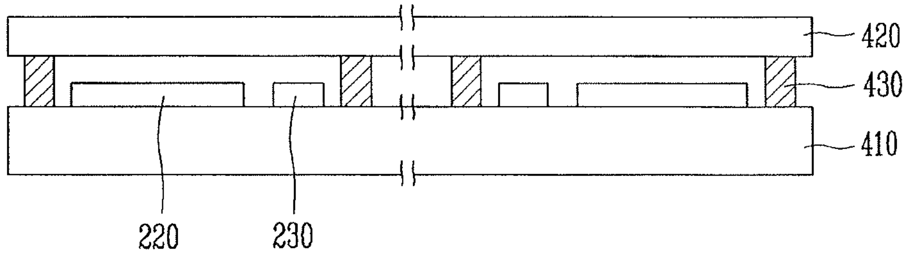
FIG. 3 illustrates a cross-sectional view, taken along a line A-A', of the exemplary mother substrate shown in FIG. 1.

In the exemplary embodiment illustrated in FIGS. 2 and 3, one scan driver 230 arranged on one side of the pixel unit 220 is shown. However, embodiments of the present invention need not be limited thereto. For example, two scan drivers 230 may be arranged on both sides of the pixel unit 220, or an emission control driver for generating an emission control signal may be formed in a separate region.

After the light emitting display device 210 is scribed from the mother substrate 200, the data driver 240 of the respective light emitting display device 210 may generate a data signal corresponding to data supplied from the outside through the pad unit 270. The data signal generated in the data driver 240 may be supplied to the data lines (D1 to D3*m*) through the data distributor 250.

The data distributor 250 may be connected between the data driver 240 and the data lines (D1 to D3*m*), and more particularly, between the output lines (O1 to Om) of the data driver 240 and first ends of the data lines (D1 to D3*m*). The data distributor 250 may respectively supply data signal(s), which may be received via the output lines (O1 to Om) of the data driver 240, to the plurality of the data lines (D1 to D3*m*).

The data distributor 250 may receive selection signals, e.g., CLR, CLG, CLB, etc., from the pad unit 270 after the organic light emitting display devices 210 are scribed from the mother substrate 200.

The data distributor 250 may be set to be turned off by a bias signal (Vbias) supplied from a thirteenth wire 630 of the second wire group 600 when the test on the organic light emitting display device 210 is carried out on the mother substrate 200. If a test signal was to be supplied via the data distributor 250, a suitable image may not be displayed or it may be difficult to synchronize the selection signals because the selection signals may in such cases be delayed if supplied via the data distributor 250 through the first or second wire group 500, 600. Therefore, in such cases, a sufficient amount of time for charging a data voltage in the pixel(s) may not be ensured.

Embodiments of the invention overcome such problems by, e.g., providing a separate transistor group 260 for supplying a test signal to each of the organic light emitting display devices 210. That is, in embodiments of the invention, when the organic light emitting display device(s) 210 on the mother substrate 200 are being tested, the respective test signals may be supplied via the separate transistor group 260 instead of the data distributor 250. In embodiments of the invention, the transistor group 260 may be connected to second ends of the data lines (D1 to D3*m*). That is, in some embodiments of the invention, the data distributor 250 and the transistor group 260 may be arranged so as to be connected to different ends of the data lines (D1 to D3*m*), and the ends of the data lines (D1 to D3*m*) may extend beyond the pixel unit 220 of the respective organic light emitting display 210.

The transistor group 260 may include a plurality of transistors (M1 to M3*m*) whose gate electrodes are commonly connected to a fifteenth wire 650 of the second wire group 600.

A source electrode of each of the transistors (M1 to M3*m*) may be connected to one of a sixteenth wire to an eighteenth wire 660 to 680 of the second wire group 600, and a drain electrode of each of the transistors (M1 to M3*m*) may be connected to one of the data lines (D1 to D3*m*). In some embodiments of the invention, transistors (M1, M4, . . . , M3*m*−2) connected to the eighteenth wire 680 may be connected to data lines (D1, D4, . . . , D3*m*−2) of a red subpixel, transistors (M2, M5, . . . , M3*m*−1) connected to a seventeenth wire 670 may be connected to data line (D2, D5, D3*m*−1) of a green subpixel, and transistors (M3, M6, . . . , M3*m*) connected to the sixteenth wire 660 may be connected to data line (D3, D6, . . . , D3*m*) of a blue subpixel.

When the organic light emitting display device 210 on the mother substrate 200 is being tested, transistors (M1 to M3*m*) of the transistor group 260 may be simultaneously turned on by a test control signal, which may be supplied through the fifteenth wire 650. As discussed above, the fifteenth wire 650 may be connected to gate electrodes of the transistors (M1 to M3*m*). Thus, the transistors (M1 to M3*m*) themselves may supply the test signal, supplied from a wire connected to the source electrodes of the transistors (M1 to M3*m*) of the transistor group 260, to the data line (D).

The transistor group 260 may maintain a turned-off state based on a control signal, which may be externally supplied after the organic light emitting display devices 210 are scribed from the mother substrate 200.

The pad unit 270 may transfer power source voltages and signals, which may be externally supplied, to each of the organic light emitting display devices 210. For example, the pad unit 270 may transfer the power source voltages and the driving signals supplied, e.g., from a printed circuit board, etc., to at least one of the pixel unit 220, the scan driver 230, the data driver 240 and the data distributor 250. The pad unit 270 may include a plurality of pads.

The first circuit unit 280 may be a circuit employable for testing the organic light emitting display 210, and may independently control a predetermined signal supplied to the organic light emitting display device 210 when the test on at least one organic light emitting display device 210 is carried out in the mother substrate 200. The first circuit unit 280 may independently control at least one of the scan control signals SCS supplied to the scan driver 230.

For example, when one or some organic light emitting display devices 210 are erroneously operated due to a signal delay, etc., that may occur while testing at least one organic light emitting display device 210 arranged on the mother substrate 200, the first circuit unit 280 may have a function of independently turning off the erroneously operated organic light emitting display device.

Thus, the first circuit unit 280 may be connected between the scan driver 230 and a predetermined wire included in the first or second wire group 500, 600. For example, the first circuit unit 280 may be connected to the scan driver 230, and a second wire 520, the third wire 530 and the fourth wire 540 of the first wire group 500 and an eleventh wire 610 of the second wire group 600.

Such a first circuit unit 280 may control the scan driver 230 by generating a predetermined control signal corresponding to the power source voltages and signals supplied from the second wire 520, the third wire 530, the fourth wire 540 and the eleventh wire 610, and may output the predetermined control signal to the scan driver 230. The first circuit unit 280 may include at least one logic gate for generating a control signal, e.g., the predetermined control signal. The logic gate included in the first circuit unit 280 will be described below in detail.

The first circuit unit 280 may not affect an operation of the organic light emitting display devices 210 after the testing of the at least one organic light emitting display device 210 on the mother substrate 200 is completed and/or the organic light emitting display devices 210 have been scribed.

Thus, in some embodiments of the invention, the first circuit unit 280 may be arranged between the scribing line (a first line) 310 and the grinding line (a second line) 320, and electrical connection points between the first circuit unit 280 and the first and second wire groups 500, 600 may be positioned outside of the scribing line 310. In the following description, the scribing line 310 may correspond to a line for separating each of the organic light emitting display devices 210 from the mother substrate 200, and the grinding line 320 may correspond to a line for additionally grinding along a model of the organic light emitting display device 210 after the scribing process has been completed. A position of the grinding line 320 may generally correspond to a lower end of the pad unit 270. A region between the scribing line 310 and the grinding line 320 may be called an edge region. That is, the first circuit unit 280 may be arranged in the edge region, namely between the pad unit 270 and the scribing line 310.

A width (W) of the edge region may be varied according to the model of the organic light emitting display device 210. In some embodiments of the invention, the edge region may be less than or equal to about ±300 μm from the scribing line 310. That is, e.g., in some embodiments of the invention, the first circuit unit 280 may be arranged at or within a distance of about 300 μm from the scribing line 310.

The second circuit unit 290 may be a measuring circuit. More particularly, the second circuit unit 290 may measure a scan signal generated in the scan driver 230 of each of the organic light emitting display devices 210 and supplied to the pixel unit 220.

The second circuit unit 290 may be connected between any one of a plurality of the scan lines and the predetermined wire included in the first or second wire group 500, 600, and may include at least one logic gate. For example, the second circuit unit 290 may be connected between an nth scan line (Sn), and each of the third wire 530 and the fourth wire 540 of the first wire group 500 and a twelfth wire 620 of the second wire group 600. In embodiments in which a shift control signal is generated in the first circuit unit 280, then the second circuit unit 290 may be connected to the first circuit unit 280 so that it may receive the shift control signal from the first circuit unit 280.

Such a second circuit unit 290 may output a scan measuring signal to the twelfth wire 620. The scan measuring signal may correspond to the scan signal output to the nth scan line (Sn), the voltages from the third and fourth power sources VDD, VSS respectively supplied from the third wire 530 and the fourth wire 540, and the shift control signal supplied from the first circuit unit 280. Then, it may be determined whether or not the scan signal is normally generated by measuring a signal output from the twelfth wire 620 when the test on the organic light emitting display device 210 on the mother substrate 200 is carried out.

In embodiments of the invention, similar to the first circuit unit 280, the second circuit unit 290 may not affect operation of the organic light emitting display devices 210 after the organic light emitting display device(s) are scribed. Thus, the second circuit unit 290 may be arranged between the scribing line 310 and the grinding line 320, and electrical connection points between the second circuit unit 290 and the first and second wire groups 500, 600 may be formed outside of the scribing line 310. In some embodiments of the invention, the second circuit unit 290 may be arranged at or within a distance of about 300 μm from the scribing line 310.

The second circuit unit 290 may measure an emission control signal that is generated in the scan driver 230 of the respective organic light emitting display devices 210 and supplied to the pixel unit 220. In such embodiments, the second circuit unit 290 may be connected between any one out of a plurality of emission control lines (EM1 to EMn) and a predetermined wire included in the first or second wire groups 500, 600. In some embodiments of the invention, a plurality of second circuit units 290 may be provided to measure a plurality of signals, e.g., two second circuits 290 may be provided to measure both the scan signal and the emission control signal.

The first wire group 500 may extend in a first direction at a border region of the organic light emitting display devices 210. More particularly, the first wire group 500 may be commonly connected to the organic light emitting display devices 210 arranged in a same column on the mother substrate 200.

Such a first wire group 500 may include, e.g., the first through fifth wires 510 to 550. The first wire 510 may receive the voltage of the first power source ELVDD. The second wire 520 may receive a vertical control signal (VC). The third wire 530 may receive the voltage of the third power source VDD. The fourth wire 540 may receive the fourth power source voltage VSS. The fifth wires 550 may receive the scan control signal(s) SCS.

The first wire 510 may supply the voltage of the first power source ELVDD, which may be supplied to the first wire 510 during testing of the at least one organic light emitting display device 210 on the mother substrate 200, to the pixel unit 220 of the organic light emitting display devices 210 connected to the first wire 510 itself.

The second wire 520 may supply the vertical control signal (VC), which may be supplied to the second wire 520 during testing of the at least one organic light emitting display device 210 on the mother substrate 200, to the first circuit unit 280 connected to the second wire 520 itself.

The third wire 530 may supply the voltage of the third power source voltage, which may be supplied to the third wire 530 during testing of the at least one organic light emitting display device 210 on the mother substrate 200, to the scan driver 230, the first circuit unit 280 and the second circuit unit 290 of the organic light emitting display device(s) 210 connected to the third wire 530 itself.

The fourth wire 540 may supply the voltage of the fourth power source VSS, which may be supplied in the fourth wire 540 during testing of the at least one organic light emitting display device 210 on the mother substrate 200, to the scan driver 230, the first circuit unit 280 and the second circuit unit 290 of the organic light emitting display device(s) 210 connected to the fourth wire 540 itself.

The fifth wires 550 may supply the scan control signals SCS, which may be supplied to the fifth wires 550 during the testing of the at least one organic light emitting display device 210 on the mother substrate 200, to the scan driver 230 of the organic light emitting display devices 210 connected to the fifth wire 550 itself. The scan control signals (SCS) supplied to the scan driver 230 may include a clock signal, an output enable signal, and a start pulse, etc. A number of the scan control signals (SCS) that may be supplied to the scan driver 230 may be varied according to circuit configurations of the scan driver 230. Accordingly, the number of the wires included in the fifth wires 550 may vary widely. Although three wires are described in the exemplary embodiment described below, embodiments of the invention are not limited to such characteristics and may include, e.g., less than or more than three wires.

In some embodiments of the invention, at least one of the fifth wires 550 may supply a clock signal to the first circuit unit 280.

The second wire group 600 may extend in a second direction at a border region of the organic light emitting display devices 210. More particularly, the second wire group 600 may be commonly connected to the organic light emitting display devices 210 arranged in a same row on the mother substrate 200.

The second wire group 600 may include the eleventh through eighteenth wires 610 through 680. The eleventh wire 610 may receive a horizontal control signal (HC). The twelfth wire 620 may output a scan measuring signal. The thirteenth wire 630 may receive the bias voltage (Vbias). The fourteenth wire 640 may receive the voltage of second power source ELVSS. The fifteenth wire 650 may receive a test control signal. The sixteenth wire 660 may receive a blue test signal; a seventeenth wire 670 may receive a green test signal; and an eighteenth wire 680 may receive a red test signal.

The eleventh wire 610 may supply the horizontal control signal (HC), which may be supplied to the eleventh wire 610 during testing of the at least one organic light emitting display device 210 on the mother substrate 200, to the first circuit unit 280 of the organic light emitting display devices 210 connected to the eleventh wire 610 itself.

The twelfth wire 620 may output the scan measuring signal, which may be supplied to the twelfth wire 620 from the second circuit unit 290 during testing of the at least one organic light emitting display device 210 on the mother substrate 200.

The thirteenth wire 630 may supply the bias voltage (Vbias), which may be supplied to the thirteenth wire 630 during testing of the at least one organic light emitting display device 210 on the mother substrate 200, to the data distributor 250 of the organic light emitting display devices 210 connected to the thirteenth wire 630 itself.

The fourteenth wire 640 may supply the voltage of the second power source ELVSS, which may be supplied during testing of the at least one organic light emitting display device 210 on the mother substrate 200, to the pixel unit 220 of the organic light emitting display devices 210 connected to the fourteenth wire 640 itself.

The fifteenth wire 650 may supply the test control signal, which may be supplied to the fifteenth wire 650 during testing of the at least one organic light emitting display device 210 on the mother substrate 200, to the transistors (M1 to M3*m*) of the transistor group 260 of the organic light emitting display devices 210 connected to the fifteenth wire 650 itself.

The sixteenth wire 660 may supply a blue test signal, which may be supplied to the sixteenth wire 660 during testing of the at least one organic light emitting display device 210 on the mother substrate 200, to the transistors (M1 to M3*m*) of the transistor group 260 of the organic light emitting display devices 210 connected to the sixteenth wire 660 itself.

The seventeenth wire 670 may supply a green test signal, which may be supplied to the seventeenth wire 670 during testing of the at least one organic light emitting display device 210 on the mother substrate 200, to the transistor group 260 of the organic light emitting display devices 210 connected to the seventeenth wire 670 itself.

The eighteenth wire 680 may supply a red test signal, which may be supplied to the eighteenth wire 680 during testing of the at least one organic light emitting display device

210 on the mother substrate 200, to the transistor group 260 of the organic light emitting display devices 210 connected to the eighteenth wire 680 itself.

Each of the organic light emitting display devices 210 on the mother substrate 200 may be scribed from the mother substrate 200, e.g., after a sheet unit test is completed. In some embodiments of the invention, the scribing line 310 may be arranged such that, after scribing, the first wire group 500 and the second wire group 600 can be electrically isolated from the pixel unit 220, the scan driver 230, the data driver 240, the data distributor 250 and the transistor group 260. That is, in some embodiments of the invention, an electrical connection point between the first wire group 500 and the second wire group 600, and the pixel unit 220, the scan driver 230, the data driver 240, the data distributor 250 and the transistor group 260 may be arranged outside the scribing line 310 of the organic light emitting display device 210. Accordingly, embodiments of the invention may prevent and/or reduce noise such as electrostatics flowing in the first wire group 500 and the second wire group 600 from the outside from being supplied to the pixel unit 220, the scan driver 230, the data driver 240, the data distributor 250 and the transistor group 260.

In cases employing the exemplary mother substrate 200 describe above, a test on one, some or all of the organic light emitting display devices 210 may be carried out without scribing a plurality of organic light emitting display devices 210 formed on the mother substrate 200 because the mother substrate 200 may include the first and second wire groups 500, 600.

Wires supplying the voltages of the first and second power source ELVDD, ELVSS may extend in different directions and may be employed to carry out a test on respective ones of the organic light emitting display device 210 during testing of the organic light emitting display devices on the mother substrate 200.

The predetermined signal supplied to the respective organic light emitting display device 210 may be independently controlled using, e.g., the first and second circuit units 280, 290 on the mother substrate 200. Accordingly, each of the organic light emitting display devices 210 may be independently controlled, by, e.g., turning off the respective organic light emitting display devices when testing of another or other ones of the organic light emitting display devices 210 are carried out.

In some embodiments of the invention, each of the organic light emitting display devices 210 may be independently driven, e.g., completely independently driven, and may substantially and/or completely avoid erroneous operation that may result from, e.g., wire interference between the first and second wire groups 500, 600 after scribing, by arranging the first and second circuit units 280, 290 between the scribing line 310 and the grinding line 320 and separating the electrical connection point between the first and second circuit units 280, 290 and the first and second wire groups 500, 600.

FIG. 2 illustrates a schematic diagram of one of the exemplary organic light emitting display devices shown in FIG. 1.

Referring to FIG. 2, each of the organic light emitting display devices 210 may be independently driven, e.g., completely independently driven, and may avoid erroneous operation that may result from interference of wires by electrically disconnecting the organic light emitting display devices 210 from the first and second wire group 500, 600 after scribing. That is, in some embodiments of the invention, an end of the first and second wire groups 500, 600 may be electrically disconnected and maintained in an electrically open state, and the power sources and signals for driving the organic light emitting display device 210 may be supplied by an external circuit (not shown), such as a printed circuit board, connected to the pad unit 270.

The first circuit unit 280 and the second circuit unit 290 may be arranged between the pad unit 270 and a side edge of the organic light emitting display device 210. For example, as shown in FIG. 2, the first circuit unit 280 and the second circuit unit 290 may be disposed below the pad portion and above the side edge, which may correspond to the scribing line 310. More particularly, e.g., in some embodiments of the invention, if a width between the pad unit 270 and the edge region of the organic light emitting display device 210 is 300 μm, then the first and second circuit units 280, 290 may be arranged within a distance of 300 μm from the side edge of the organic light emitting display device 210.

In some embodiments of the invention, the first circuit unit 280 may be arranged between the scan driver 230 and the side edge of the organic light emitting display device 210. That is, as shown in FIG. 2, one or more signal lines, e.g., signal lines extending from one side, of the first circuit unit 280 may be connected, e.g., to the pad portion 270 and/or the scan driver 230 and other signal lines, e.g., signal lines extending from another side, of the first circuit unit 280 may be electrically disconnected and maintained in an open state.

Similarly, one or more signal lines, e.g., signal lines extending from one side, of the second circuit unit 290 may be connected, e.g., to one or more of the plurality of scan lines, e.g., nth scan line Sn, and other signal lines, e.g., signal lines extending from another side, of the second circuit unit 290 may be electrically disconnected and maintained in an open state.

FIG. 2 illustrates the exemplary organic light emitting display device 210 in a state in which the organic light emitting display device 210 has not been subjected to a grinding process. That is, the exemplary organic light emitting display device 210 illustrated in FIG. 2 has only undergone a scribing process along the scribing line 310 in order to separate the organic light emitting display device 210 from the mother substrate 200 and/or to electrically disconnect the first and/or second wire groups 500, 600 from the pixel portion 220, the scan driver 230, the data distributor 25, the data driver 240, etc. Thus, in some embodiments of the invention, the organic light emitting display device 210 may only undergo a scribing process.

However, embodiments of the invention need not be limited thereto. For example, in some embodiments of the invention, the organic light emitting display device may be subjected to a scribing process and a grinding process. In such cases, e.g., the grinding process may be carried out along the grinding line 320. In cases in which the first and second circuit units 280, 290 are arranged outside the grinding line 320, the first and second circuit units 280, 290 may be separated from the organic light emitting display device 210 as a result of the grinding process.

As discussed above, the first and second circuit units 280, 290 may independently control and measure predetermined signals supplied to the respective organic light emitting display device 210. In some embodiments of the invention, the first and second circuit units 280, 290 may be arranged between the scribing line 310 and the grinding line 320, but embodiments of the present invention are not limited thereto. For example, some of the first and/or second circuit units 280, 290 may be arranged outside of the scribing line 310. In such cases, the first and/or second circuits 280, 290 arranged outside of the scribing line 310 may be removed as a result of the scribing process. In some embodiments of the invention, at least some of the first and second circuit units 280, 290 may be arranged between the scribing line 310 and the grinding line 320, and some of the first and second circuit units 280, 290 may be arranged outside the scribing line 310.

In some embodiments of the invention, the above-mentioned organic light emitting display devices 210 on the mother substrate 200 may be protected from oxygen and moisture by a sealer 430, which may be provided between a supporting substrate 410 and a sealing substrate 420. The sealing substrate 420 may be arranged so as to overlap at least one region of the supporting substrate 410.

FIG. 3 illustrates a cross-sectional view taken along a line A-A' of the mother substrate 200 shown in FIG. 1.

Referring to FIG. 3 in combination with FIG. 1, each of the organic light emitting display devices 210 formed on the mother substrate 200 may include the supporting substrate 410, the sealing substrate 420 and the sealer 430.

The supporting substrate 410 may be arranged below the pixel unit 220 and the scan driver 230, i.e., the pixel unit 220 and the scan driver 230 may be disposed on the supporting substrate 410. The sealing substrate 420 may be arranged above the supporting substrate 410, i.e., the sealing substrate 420 may be arranged above the supporting substrate 410 and more particularly, the sealing substrate 420 may be arranged above the pixel portion 220 and the scan driver 230. The sealer 430 may be disposed between the supporting substrate 410 and the sealing substrate 420.

More particularly, to prevent the organic light emitting diode from infiltration of oxygen and moisture, the sealing substrate 420 may first be arranged above the pixel unit 220 and/or the scan driver 230, and then may be attached to the supporting substrate 410 using the sealer 430. That is, a region between the sealing substrate 420 and the supporting substrate 410 that is sealed by the sealer 430 may include at least one pixel unit 220. For example, the sealing substrate 420 may be arranged above the pixel unit 220 and the scan driver 230, and the sealer 430 may be coated along an edge of the sealing substrate 420 in order to attach the supporting substrate 410 and the sealing substrate 420 to each other. That is, the sealer 430 may be formed in a region outside the pixel unit 220, which may include the organic light emitting diode.

In some embodiments of the invention, the sealing substrate 420 may be formed so as not to overlap the data driver 240 and the data distributor 250. More particularly, e.g., in some cases, the data driver 240 and the like may be installed as chips after the sealing process has been completed, e.g., after the sealing substrate 420 and the supporting substrate 410 have been sealed together.

In some embodiments of the invention, as discussed above, an additional grinding process may be carried out along the grinding line(s) 320 and the first and second circuit units 280, 290 may be removed from the organic light emitting display device 210 as a result of such grinding. However, in cases in which a laser is employed to seal the supporting substrate 410 and the sealing substrate 420, components of the organic light emitting display device 210 may be arranged a predetermined distance away from the region to be irradiated. For example, in cases in which the data driver 240 and the data distributor 250 are provided as chips installed after the sealing process, care may need to be taken in order to prevent damage to the first and second circuit units 280, 290. In some embodiments, to prevent damage to the first and second circuit units 280, 290 as a result of a laser that may be irradiated during the sealing process, the sealing substrate 420 may be arranged so as not to overlap the first and second circuit units 280, 290, and the sealer 430 may be spaced a predetermined distance away from the first and second circuit unit 280, 290.

In some cases, a frit may be used as the sealer 430. In such cases, e.g., even without employing an absorber, the frit may completely seal a region between the supporting substrate 410 and the sealing substrate 420 such that oxygen and moisture may be effectively prevented from infiltrating into a sealing region (especially, the pixel unit 220). More particularly, in some cases, two substrates may be completely sealed by hardening a melted frit.

In some cases, e.g., the frit may be provided in the form of a powder-type glass material including additives, or a glass in which the frit is generally melted and formed in the related art of glass, and therefore it may be considered that the frit includes both of the glass material and the glass in this application. Such a frit may include transition metals. Oxygen and moisture may be prevented from infiltrating between two substrates as a result of the frit completely sealing a region between the supporting substrate 410 and the sealing substrate 420. The frit may be melted by a laser or an infrared ray and hardened.

More particularly, in some embodiments of the invention, the frit may be coated on the sealing substrate 420 in the form of a frit paste state, and may include an absorber for absorbing a laser or infrared rays and a filler for reducing a thermal expansion coefficient, and may be calcined to remove moisture or an organic binder included in the paste, and then hardened. The frit paste may be a gel-state paste obtained by adding oxide powders and organic materials to the glass powder.

The frit disposed between the supporting substrate 410 and the sealing substrate 420 may be irradiated by a laser (or the like). However, the laser may damage circuit elements in the vicinity of the frit, e.g., circuit elements that are overlapped with the frit.

Accordingly, in some embodiments of the present invention, the first and the second circuit units 280, 290 may not overlap the frit 430 in order to prevent heat damage to the first and the second circuit units 280, 290. Thus, in some embodiments of the invention, the first and the second circuit units 280, 290 may be disposed in an edge region that is spaced a predetermined distance away from the frit. In some cases, the sealing substrate 420 of the organic light emitting display device 210, arranged in an nth+1 (n is an integer) row on the mother substrate 200, may be spaced apart from the scribing line 310 of the organic light emitting display device 210 arranged in an nth row by a predetermined distance.

Accordingly, by arranging the first and second circuit units 280, 290 at least a predetermined distance away from the frit, embodiments of the invention may enable electrical shorts that may result, e.g., from defects in spacers in a sealing region, and/or thermal damage by laser to be prevented.

Accordingly, embodiments of the invention may enable the first and second circuit units 280, 290 to be protected from damage or deformation from, e.g., the laser, such that the first and second circuit units 280, 290 may independently control and measure predetermined signals to be supplied to the respective organic light emitting display device when the test on the organic light emitting display device 210 on the mother substrate 200 is carried.

Figure 4:
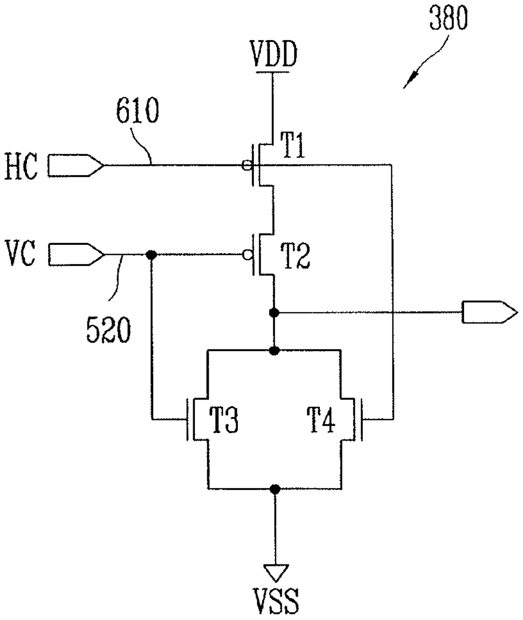
FIG. 4 illustrates a circuit diagram of a first exemplary embodiment of a logic gate employable by the first circuit unit shown in FIGS. 1 and 2.
Figure 5:
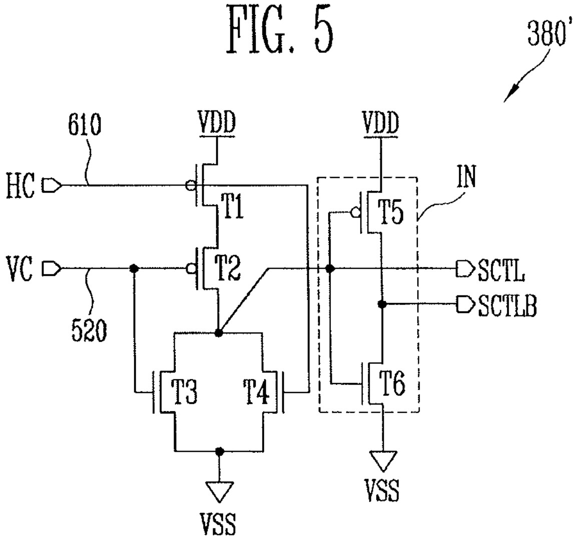
FIG. 5 illustrates a circuit diagram of a second exemplary embodiment of a logic gate employable by the first circuit unit shown in FIGS. 1 and 2.

FIG. 4 illustrates a circuit diagram of a first exemplary embodiment of a logic gate 380 that may be employed by the first circuit unit 280 shown in FIG. 1 2. FIG. 5 illustrates a circuit diagram of a second exemplary embodiment of a logic gate 380' that may be employed by the first circuit unit 280 shown in FIGS. 1 and 2. More particularly, the second exemplary logic gate 380' illustrated in FIG. 5 includes the first exemplary logic gate 380 shown in FIG. 4.

Referring to FIGS. 4 and 5, the first logic gate 380 may include an NOR gate.

The NOR gate may include first to fourth transistors (T1 to T4) connected between the third power source voltage VDD and the fourth power source VSS having a lower voltage value than that of the voltage of the third power source VDD.

More particularly, the first and second transistors (T1, T2) may be connected in series between the third power source VDD and the fourth power source VSS, and may be P-type transistors. The third and fourth transistors (T3, T4) may be connected in parallel between the second transistor (T2) and the fourth power source voltage VSS, and may be N-type transistors. Gate electrodes of the first and fourth transistors (T1, T4) may be connected to the eleventh wire 610 to receive the horizontal control signal (HC), and gate electrodes of the second and third transistor (T2, T3) may be connected to the second wire 520 to receive the vertical control signal (VC).

Such an NOR gate may output a signal having a high level voltage value corresponding to the voltage of the third power source VDD only if both the horizontal control signal (HC) and the vertical control signal (VC) supplied to the NOR gate itself have a low level voltage value.

The above-mentioned NOR gate may be used for generating a shift control signal by outputting a signal having a predetermined voltage value corresponding to the horizontal control signal (HC) and the vertical control signal (VC).

Referring to FIGS. 4 and 5, the output signal of the NOR gate may be used as a first shift control signal (SCTL). Referring to FIG. 5, a second shift control signal (SCTLB) may be generated by connecting an inverter (IN) to an output terminal of the NOR gate for inverting the first shift control signal (SCTL). That is, the second exemplary logic gate 380' may include the inverter (IN) and the NOR gate of the first exemplary logic gate 380.

The inverter (IN) of the second exemplary logic gate 380' may include the fifth and sixth transistors (T5, T6) connected in series between the third power source VDD and the fourth power source VSS. A gate electrode of the fifth and sixth transistors (T5, T6) may be connected to the output terminal of the NOR gate. The fifth and sixth transistors (T5, T6) may be formed of different transistor types, i.e., the fifth transistor (T5) may be an P-type transistor and the sixth transistor (T6) may be an N-type transistor.

As described above, the first shift control signal (SCTL) and the second shift control signal (SCTLB) output from the logic circuits shown in FIGS. 4 and 5 may be used to generate a shift clock signal for controlling the scan driver 230. Details about these features will be described below.

Figure 6:
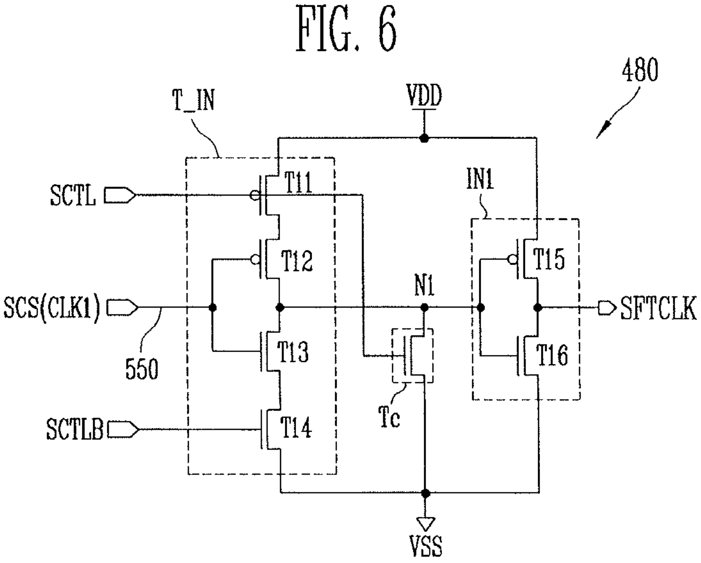
FIG. 6 illustrates a circuit diagram of a third exemplary embodiment of a logic gate employable by the first circuit unit shown in FIGS. 1 and 2.
Figure 7:
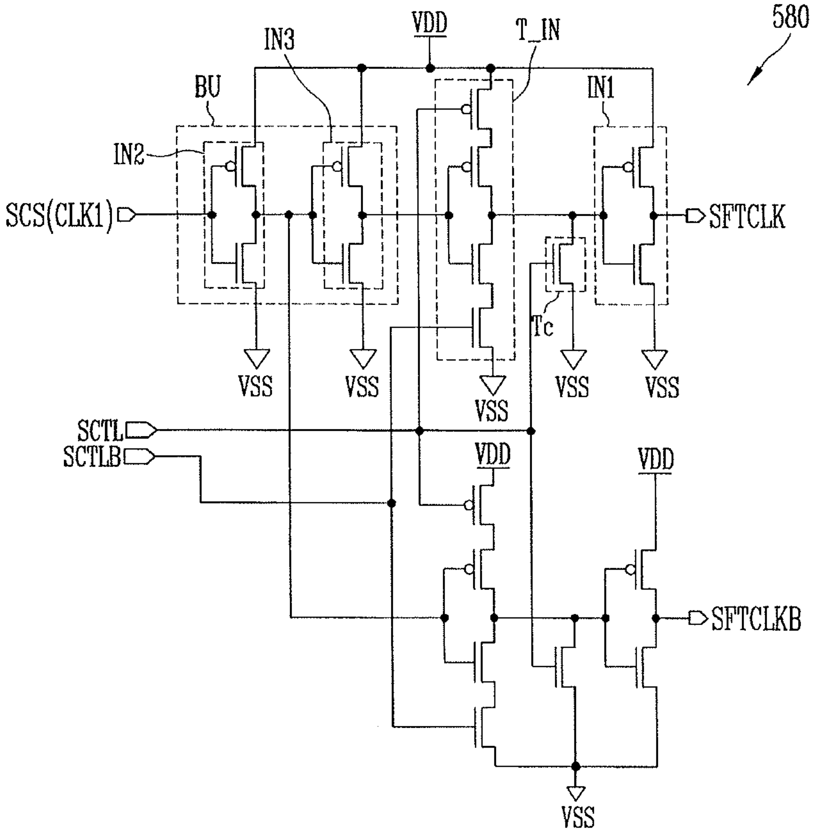
FIG. 7 illustrates a circuit diagram of a fourth exemplary embodiment of a logic gate employable by the first circuit unit shown in FIGS. 1 and 2.

FIGS. 6 and 7 respectively illustrate third and fourth exemplary embodiments 480, 580 of a logic gate that may be included in the first circuit unit 280 shown in FIGS. 1 and 2. As shown in FIG. 7, the fourth exemplary logic gate 580 includes the third exemplary logic gate 480 shown in FIG. 6.

Referring to FIGS. 6 and 7, the first and second exemplary logic gates 480, 580 may include a generation circuit of the first shift clock signal (SFTCLK) having a tristate inverter (T_IN), a control transistor (Tc) and an inverter (IN1).

The tristate inverter (T_IN) may include eleventh to fourteenth transistors (T11 to T14) connected in series between the third power source VDD and the fourth power source VSS. The eleventh and twelfth transistors (T11, T12) may be P-type transistors, and the thirteenth and fourteenth transistors (T13, T14) may be N-type transistors. A gate electrode of the eleventh transistor (T11) may be connected to the output terminal of the NOR gate, as shown in FIG. 4 and FIG. 5, and may thereby receive the first shift control signal (SCTL). Gate electrodes of the twelfth and thirteenth transistors (T12, T13) may be connected to one of the fifth wires 550 receiving the scan control signal, and may thereby receive the first clock signal (CLK1). A gate electrode of the fourteenth transistor (T14) may be connected to an output end of a combinational logic gate of the NOR gate and inverter (IN) shown in FIG. 5, and may thereby receive the second shift control signal (SCTLB).

The control transistor (Tc) may be connected between the fourth power source voltage VSS and a first node (N1), which may be an output terminal of the tristate inverter (T_IN). The control transistor Tc may be an N-type transistor. A gate electrode of the control transistor (Tc) may be connected to the output terminal of the NOR gate shown in FIGS. 4 and 5, and may thereby receive the first shift control signal (SCTL).

The inverter (IN1) may include fifteenth and sixteenth transistors (T15, T16) connected in series between the third power source VDD and the fourth power source VSS. Gate electrodes of the fifteenth and sixteenth transistors (T15, T16) may be commonly connected to the first node (N1).

Such a generation circuit of the first shift clock signal (SFTCLK) may generate the first shift clock signal (SFTCLK) having a high level voltage regardless of the first clock signal (CLK1) if the first shift control signal (SCTL) having a high level voltage and the second shift control signal (SCTLB) having a low level voltage are supplied thereto. In other cases, the generation circuit of the first shift clock signal (SFTCLK) may generate the first shift clock signal (SFTCLK) having a same waveform as the first clock signal (CLK1). For example, if the generation circuit receives the first shift control signal (SCTL) having a low level voltage and the second shift control signal (SCTLB) having a high level voltage, the generation circuit may generate the first clock signal (CLK1) having a same waveform as the first clock signal (CLK1).

In some embodiments of the invention, the first circuit unit 280 may include logic gates that further include a generation circuit of a second shift clock signal (SFTCLKB), as shown in FIG. 7.

The logic gates shown in FIG. 7 are identical to the logic gates shown in FIG. 6, except that the logic gates shown in FIG. 7 further include two inverters (IN2, IN3), namely buffers (BU), at an input terminal of the first clock signal (CLK1) in the generation circuit of the first shift clock signal (SFTCLK) shown in FIG. 6, and input terminals of the first and second shift control signals (SCTL, SCTLB) of the second shift clock signal (SFTCLKB) are reversed. Therefore, a detailed description of the logic gates shown in FIG. 7 is omitted.

Such a generation circuit of the first and second shift clock signals (SFTCLK, SFTCLKB) may generate the first and second shift clock signals (SFTCLK, SFTCLKB) having a high level voltage regardless of the first clock signal (CLK1) if the first shift control signal (SCTL) having a high level voltage and the second shift control signal (SCTLB) having a low level voltage are supplied thereto. The generation circuit of the first and second shift clock signals (SFTCLK, SFTCLKB) may generate the first shift clock signal (SFTCLK) having the same waveform as that of the first clock signal (CLK1), and the second shift clock signal (SFTCLKB) having a reversed waveform to that of the first clock signal (CLK1) in other cases, e.g., if the generation circuit of the first and second shift clock signals (SFTCLK, SFTCLKB) receives the first shift control signal (SCTL) having a low level voltage and the second shift control signal (SCTLB) having a high level voltage.

As described above, if the logic gates as shown in FIG. 4 to FIG. 7 are included in the first circuit unit 280, then the generation circuit of the first and second shift clock signals (SFTCLK, SFTCLKB) may generate first and second shift clock signals (SFTCLK, SFTCLKB) corresponding to a predetermined horizontal control signal (HC) and a predetermined vertical control signal (VC), and may output the first and second shift clock signals (SFTCLK, SFTCLKB) to the scan driver 230 to independently control the scan driver 230.

For example, if only a certain one or ones of the organic light emitting display devices 210 have to be turned off for testing one or some others of the organic light emitting display devices 210 on the mother substrate 200, then the vertical control signal (VC) having a low level and the horizontal control signal (HC) having a low level may be respectively supplied to the second wire 520 and the eleventh wire 610 connected to the certain organic light emitting display device (s) 210. Then, the first circuit unit 280 receiving the vertical control signal (VC) having the low level and the horizontal control signal (HC) having the low level may generate a high level for the first and second shift clock signals (SFTCLK, SFTCLKB) regardless of the first clock signal (CLK1). The high levels of the first and second shift clock signals (SFTCLK, SFTCLKB) generated in the first circuit unit 280 may be input into the scan driver 230 to generate a scan signal and/or an emission control signal for controlling the pixel unit 220 to be turned off. However, this is only an exemplary embodiment of one or more aspects of the invention. In embodiments of the invention, signals to be input and their voltage levels may vary according to the circuit configuration of the scan driver 230.

As discussed above, in some embodiments of the invention, at least some of the first circuit unit 280 may be arranged in the edge region between the scribing line 310 and the grinding line 320, and in such cases, the above-mentioned logic gates may be arranged in the edge region of the organic light emitting display devices 210.

Figure 8:
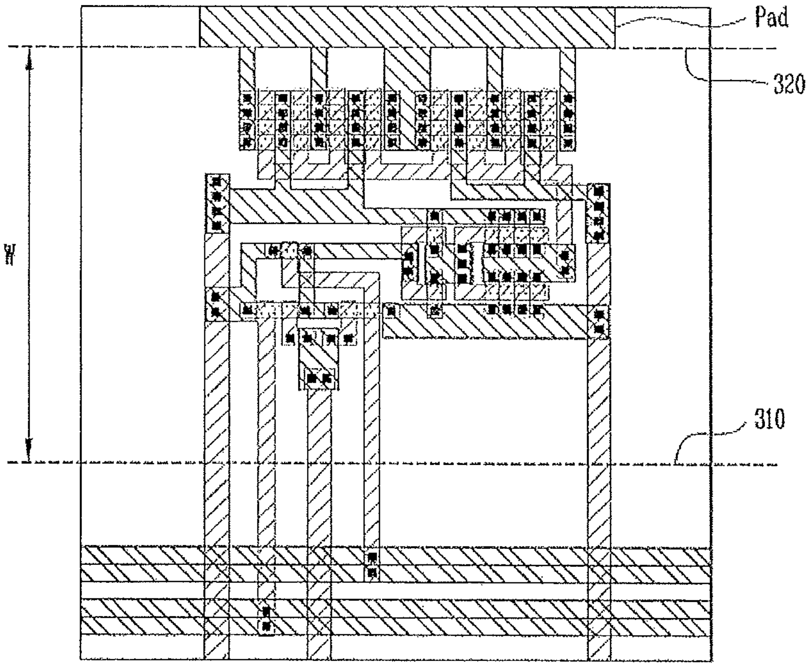
FIG. 8 illustrates a layout diagram of the fourth exemplary embodiment of the logic gate shown in FIG. 7, as formed in region B of FIG. 1.

FIG. 8 illustrates a layout diagram of the fourth exemplary embodiment of the logic gate shown in FIG. 7, as formed in region B of FIG. 1. For example, the logic gates such as the tristate inverters (T_IN), the buffers (BU) and the inverters (IN) may be arranged between the scribing line 310 on the second wire group 600 and the grinding line 320 beneath the pad unit 270. As shown in FIG. 8, a width (W) of the region between the grinding line 320 and the scribing line 310 along the edge region of the organic light emitting display device 210 may be at or within a range of about 200 μm to 300 μm.

As shown in FIG. 6, in some embodiments of the invention, the control transistor (Tc) may be an N-type transistor. However, embodiments of the invention are not limited thereto.

Figure 9:
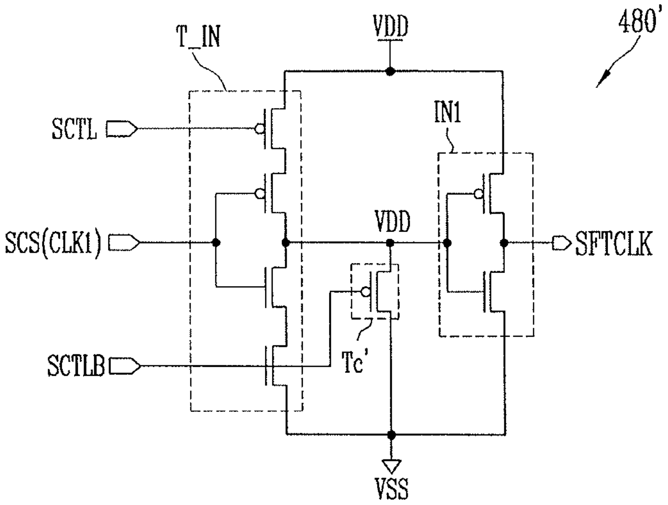
FIG. 9 illustrates a circuit diagram of a fifth exemplary embodiment of a logic gate employable by the first circuit unit shown in FIGS. 1 and 2.

FIG. 9 illustrates a circuit diagram of a fifth exemplary embodiment of a logic gate employable by the first circuit unit shown in FIGS. 1 and 2. The exemplary logic gate 480' illustrated in FIG. 9 substantially corresponds to the exemplary logic gate 480 illustrated in FIG. 6, except for the control transistor (Tc') being a P-type transistor. In this case, the logic gate 480' shown in FIG. 9 may be configured and driven in the same manner in the logic gate 480 as shown in FIG. 6, except that the control transistor (Tc') may receive the second shift control signal (SCTLB). Therefore the other components of the logic gate 480' shown in FIG. 9 have the same reference numerals as those of the logic gate 480 shown in FIG. 6 and their detailed descriptions are omitted.

Figure 10:
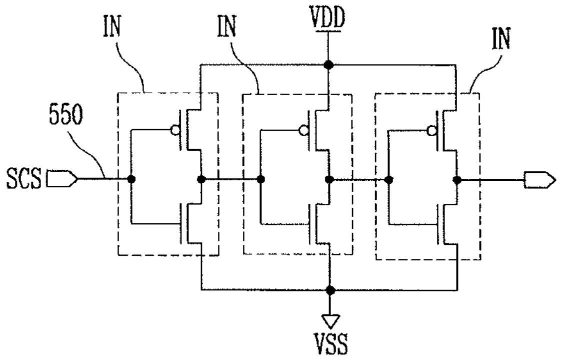
FIG. 10 illustrates a circuit diagram of a sixth exemplary embodiment of a logic gate employable by the first circuit unit shown in FIGS. 1 and 2.

FIG. 10 illustrates a circuit diagram of a sixth exemplary embodiment of a logic gate employable by the first circuit unit shown in FIGS. 1 and 2.

Referring to FIG. 10, the first circuit unit 280 may include a plurality of inverters (IN). Each of the inverters (IN) may include different types of transistors that are connected in series between the third power source VDD and the fourth power source VSS. The first circuit unit 280 may receive a scan control signal (SCS) from one of the fifth wires 550 of the first wire group 500, and may repeatedly invert (three times in FIG. 10) and output the scan control signal (SCS) using each of the inverters (IN).

If the input signals are delayed, then such a first circuit unit 280 may be effective to prevent the organic light emitting display device 210 (especially, the scan driver 230) from being erroneously operated by compensating for a delay of the scan control signal (SCS), which may be supplied from the first or second wire group 500, 600 when testing of the organic light emitting display device on the mother substrate 200 is being out. That is, in some embodiments of the invention, the first circuit unit 280 may have a function of compensating for the delay.

If, as described above, the first circuit unit 280 includes a plurality of inverters (IN) to compensate for a delay of input signals, the first circuit unit 280 may be arranged between the scan driver 230 and the fifth wires 550 to which the scan control signal (SCS) may be supplied from the outside.

In some embodiments of the invention, the first circuit unit 280 may include a transmission gate, an NAND gate or an exclusive XOR gate, in addition to the logic gates as described above. The transmission gate may be used for the purpose of selectively turning on the respective organic light emitting display device(s) 210 formed on the mother substrate 200, and the NAND gate or the exclusive XOR gate may be used for the purpose of generating a shift control signal (SCTL) and/or a shift clock signal (SFTCLK) and the like.

Figure 11:
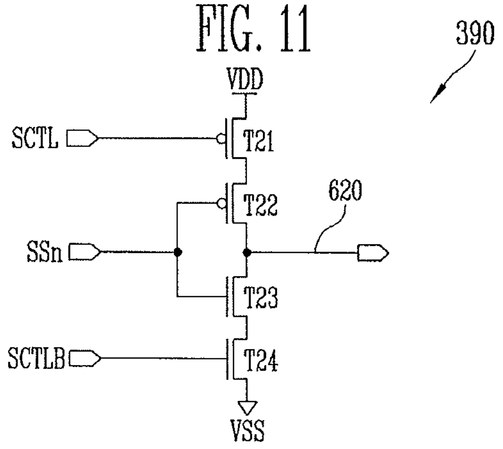
FIG. 11 illustrates a circuit diagram of a seventh exemplary embodiment of a logic gate employable by the first circuit unit shown in FIGS. 1 and 2.

FIG. 11 illustrates a circuit diagram of a seventh exemplary embodiment of a logic gate employable by the first circuit unit shown in FIGS. 1 and 2.

Referring to FIG. 11, the second circuit unit 290 may include a tristate inverter 390 connected between the third power source VDD and the fourth power source VSS.

The tristate inverter may include twenty first to twenty fourth transistors (T21 to T24) connected in series between the third power source voltage VDD and the fourth power source voltage VSS. The twenty first and twenty second transistors (T21, T22) may be P-type transistors, and the twenty third and twenty fourth transistors (T23, T24) may be N-type transistors. A gate electrode of the twenty first transistor (T21) may be connected to the first circuit unit 280 to receive the first shift control signal (SCTL). Gate electrodes of the twenty second and twenty third transistors (T22, T23) may be connected to an nth scan line (Sn) to receive an nth scan signal (SSn). A gate electrode of the twenty fourth transistor (T24) may be connected to the first circuit unit 280 to receive the second shift control signal (SCTLB).

Such a second circuit unit 290 may output the scan measuring signal, corresponding to the nth scan signal (SSn), to a twelfth wire 620 if the organic light emitting display device 210 connected to the second circuit unit 290 is normally operated, e.g., in cases other than when the first shift control signal (SCTL) is at a high level and the second shift control signal (SCTLB) is at a low level, when the test on the organic light emitting display device 210 on the mother substrate 200 is carried out. Accordingly, it may be tested whether or not a scan signal is generated normally by measuring the signals output from the twelfth wire 620 when the test on the organic light emitting display device 210 on the mother substrate 200 is carried out.

The second circuit unit 290 may receive the first and second shift control signals (SCTL, SCTLB) from the first or second wire group 500, 600 if the generation circuits of the first and second shift control signals (SCTL, SCTLB) are not included in the first circuit unit 280.

Figure 12:
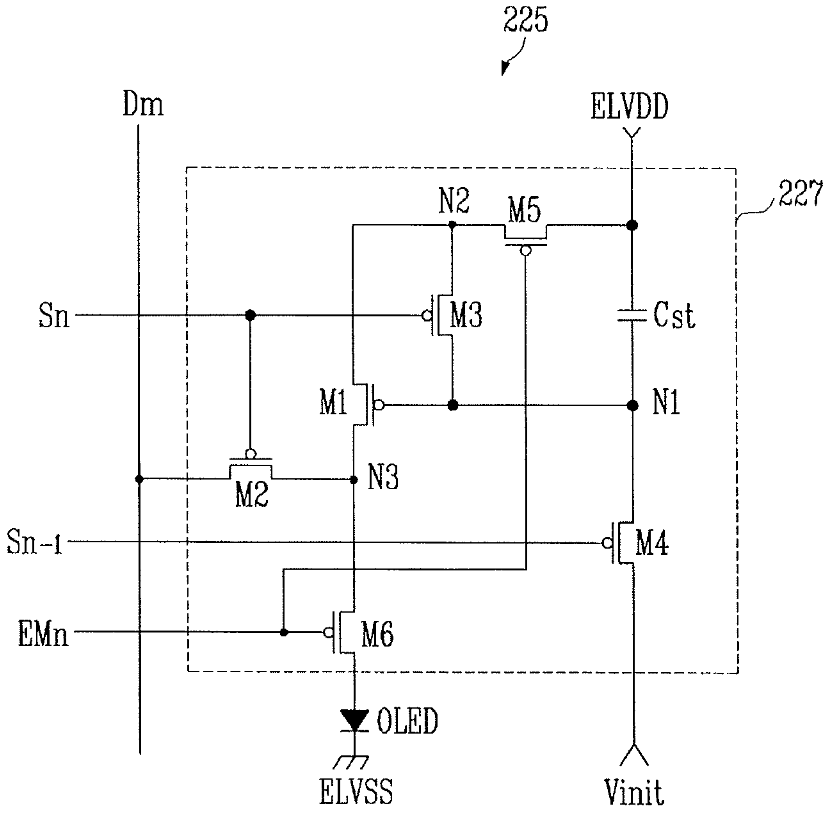
FIG. 12 illustrates a circuit diagram of an exemplary embodiment of the pixel shown in FIG. 1 and FIG. 2.

FIG. 12 illustrates a circuit diagram of an exemplary embodiment of the pixel shown in FIG. 1 and FIG. 2. Referring to FIG. 12, the pixel 225 may include an organic light emitting diode (OLED), and a pixel circuit 227 connected to the nth scan line (Sn), the nth emission control line (EMn), the mth data line (Dm), the first power source voltage ELVDD, the reset power source voltage Vinit and the organic light emitting diode (OLED) to allow the organic light emitting diode (OLED) to emit the light. The reset power source Vinit may be supplied to each pixel 225 from predetermined wires (not shown), belonging to the first or second wire group 500, 600 when the test on the organic light emitting display device 210 on the mother substrate 200 is carried out.

An anode electrode of the organic light emitting diode (OLED) may be connected to the pixel circuit 227, and a cathode electrode of the organic light emitting diode (OLED) may be connected to the second power source voltage ELVSS. Such an organic light emitting diode (OLED) may emit light with a predetermined luminance corresponding to an electric current supplied to the organic light emitting diode (OLED) itself.

The pixel circuit 227 may include first to sixth transistors (M1 to M6) and a storage capacitor (Cst). The first to sixth transistors (M1 to M6) may be P-type transistors, as shown in FIG. 12. Embodiments of the present invention need not be limited thereto. A first electrode of the first transistor (M1) may be connected to a second node (N2), and a second electrode of the first transistor (M1) may be connected to a third node (N3). A gate electrode of the first transistor (M1) may be connected to the first node (N1). The first transistor (M1) may supply an electric current to the third node (N3) corresponding to a voltage stored in the storage capacitor (Cst).

A first electrode of the second transistor (M2) may be connected to the mth data line (Dm), and a second electrode of the second transistor (M2) may be connected to the third node (N3). A gate electrode of the second transistor (M2) may be connected to the nth scan line (Sn). The second transistor (M2) is turned on when a scan signal is supplied to the nth scan line (Sn), and may thereby supply a data signal, supplied to the mth data line (Dm), to the third node (N3).

A first electrode of the third transistor (M3) may be connected to the second node (N2), and a second electrode of the third transistor (M3) may be connected to the first node (N1). A gate electrode of the third transistor (M3) may be connected to the nth scan line (Sn). The third transistor (M3) may be turned on when a scan signal is supplied to the nth scan line (Sn), and may thereby connect the first transistor (M1) in a diode-connected mode.

A first electrode of the fourth transistor (M4) may be connected to the reset power source voltage Vinit, and a second electrode of the fourth transistor (M4) may be connected to the first node (N1). A gate electrode of the fourth transistor (M4) may be connected to the nth−1 scan line (Sn−1). The fourth transistor (M4) may be turned on when a scan signal is supplied to the nth−1 scan line (Sn−1), and may thereby reset the storage capacitor (Cst) and a gate terminal of the first transistor (M1). Thus, a voltage level of the reset power source voltage Vinit may be set to a lower range than that of the data signal.

A first electrode of the fifth transistor (M5) may be connected to the first power source voltage ELVDD, and a second electrode of the fifth transistor (M5) may be connected to the second node (N2). A gate electrode of the fifth transistor (M5) may be connected to the nth emission control line (EMn). The fifth transistor (M5) may be turned on when an emission control signal is supplied to the nth emission control line (EMn), and may thereby transfer a voltage value of the first power source voltage ELVDD to the second node (N2).

A first electrode of the sixth transistor (M6) may be connected to the third node (N3), and a second electrode of the sixth transistor (M6) may be connected to the anode electrode of the organic light emitting diode (OLED). A gate electrode of the sixth transistor (M6) may be connected to the nth emission control line (EMn). The sixth transistor (M6) may be turned on when an emission control signal is supplied to the nth emission control line (EMn), and may thereby electrically connect the organic light emitting diode (OLED) to the third node (N3).

One terminal of the storage capacitor (Cst) may be connected to the first power source voltage ELVDD and the first electrode of the fifth transistor (M5), and another terminal of the storage capacitor (Cst) may be connected to the first node (N1). The storage capacitor (Cst) may charge a voltage corresponding to the data signal and a threshold voltage (Vth) of the first transistor (T1) when a scan signal is supplied to the nth scan line (Sn), and may maintain the charged voltage during one frame.

Figure 13:
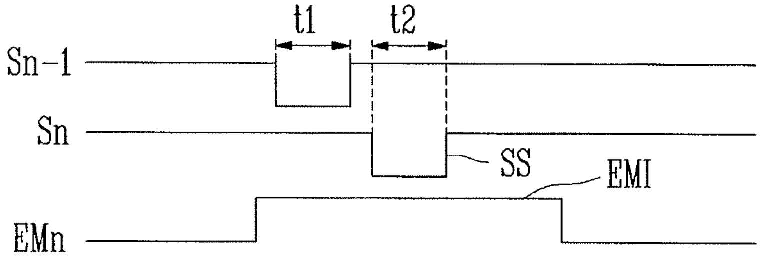
FIG. 13 illustrates an exemplary waveform diagram of driving signals for driving the pixel circuit shown in FIG. 12.

FIG. 13 illustrates an exemplary waveform diagram of driving signals for driving the pixel circuit shown in FIG. 12. Exemplary operation system of the pixel 225 as shown in FIG. 12 will be described in detail, in combination with FIGS. 12 and 13.

Referring to FIG. 13, during a first time period t1, a scan signal (SS) may be supplied to an nth−1 scan line (Sn−1), and an emission control signal (EMI) may be supplied to an nth emission control line (EMn). If the emission control signal (EMI) having a high level is supplied to the nth emission control line (EMn), then the fifth and sixth transistors (M5, M6) may be turned off. If the scan signal (SS) is supplied to the nth−1 scan line (Sn−1), then the fourth transistor (M4) may be turned on. If the fourth transistor (M4) is turned on, then the storage capacitor (Cst) and the gate terminal of the first transistor (M1) may be connected to the reset power source (Vinit). If the storage capacitor (Cst) and the gate terminal of the first transistor (M1) are connected to the reset power source (Vinit), then the reset power source (Vinit) may be supplied to the storage capacitor (Cst) and the gate terminal of the first transistor (M1), and then reset.

Subsequently, during a second period t2, a scan signal may be supplied to the nth scan line (Sn). If the scan signal (SS) is supplied to the nth scan line (Sn), then the second and third transistor (M2, M3) may be turned on. If the third transistor (M3) is turned on, then the first transistor (M1) may be diode-connected. If the second transistor (M2) is turned on, then the data signal supplied to the mth data line (Dm) may be transferred to the third node (N3). At this time, the voltage supplied to the third node (N3) may be supplied to the first node (N1) via the first and third transistors (M1, M3) because the gate terminal of the first transistor (M1) may be reset to a lower voltage value than that of the data signal by means of the reset power source (Vinit). Then, voltages corresponding to the threshold voltage (Vth) of the first transistor (M1) and the data signal may be stored in the storage capacitor (Cst).

Subsequently, the fifth and sixth transistors (M5, M6) may be turned on if the emission control signal (EMI) is not supplied to the nth emission control line (EMn), i.e., the emission control signal (EMI) has a low level. If the fifth and sixth transistors (M5, M6) are turned on, then an electric current corresponding to the data signal may flow from the first power source voltage ELVDD to the organic light emitting diode (OLED), and therefore, the lights corresponding to the data signal may be generated in the organic light emitting diode (OLED).

The above-mentioned pixel 225 may receive the scan signal (SS) and the emission control signal (EMI), which may control all of the switching transistors (M2 to M6) to be turned off, from the scan driver 230 receiving the predetermined first and second shift clock signals (SFTCLK, SFTCLKB) from the first circuit unit 280, if the organic light emitting display device 210 is set to be turned off by means of the predetermined vertical control signal (VC) and the predetermined horizontal control signal (HC) when the test on the organic light emitting display device on the mother substrate 200 is carried out.

As described above, the organic light emitting display device according to some embodiments of the present invention and the mother substrate of the same may carry out sheet unit tests on a plurality of organic light emitting display devices formed on the mother substrate prior to scribing the organic light emitting display devices because the mother substrate may include the first and second wire groups. Accordingly, the test time may be shortened, and the expense may be lowered, which result in improved test efficiency.

Also, a predetermined signal supplied to the certain organic light emitting display device may be independently controlled because the mother substrate may include the first and second circuit units. Accordingly, it is possible to independently control and measure each of the organic light emitting display devices, e.g., by turning off the erroneously operated certain organic light emitting display devices when the tests on a plurality of organic light emitting display devices on the mother substrate are carried out.

Also, the first and second circuit units may effectively control the organic light emitting display devices by preventing deformation and damage to the first and second circuit units that may occur during the sealing process because the first and second circuit units may be arranged between the scribing lines and the grinding lines and spaced at a predetermined distance apart from the sealer (especially, the frit).

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A mother substrate including a plurality of light emitting display devices, the mother substrate comprising:

a first wire group extending in a first direction in a border region of the light emitting display devices; and a second wire group extending in a second direction in the border region of the light emitting display devices, wherein each of the light emitting display devices includes:

a plurality of pixels;

a plurality of scan lines for selectively applying a scan signal to the pixels;

a plurality of data lines crossing the scan lines and applying a data signal to the pixels;

a scan driver for applying a scan signal to the scan lines; and at least one first testing unit connected between the scan driver and a predetermined wire included in the first or second wire group, wherein the scan driver generates a scan signal in response to a control signal supplied from the first testing unit based on power sources and signals supplied via the first or second wire group.

2. The mother substrate as claimed in claim 1, wherein the first testing unit is arranged between a first scribing line for separating the light emitting display devices and a second grinding line of the light emitting display devices.

3. The mother substrate as claimed in claim 2, wherein each of the light emitting display devices includes a pad unit for receiving a driving signal, and the first testing unit is arranged between the pad unit and the first scribing line.

4. The mother substrate as claimed in claim 1, wherein the first testing unit controls the scan driver based on the signals supplied from the predetermined wires included in the first and second wire group.

5. The mother substrate as claimed in claim 1, further comprising a second testing/measuring unit connected between any one of the plurality of the scan lines and the predetermined wire included in the first or second wire group.

6. The mother substrate as claimed in claim 5, wherein the second testing/measuring unit outputs an output signal to the predetermined wire included in the first or second wire group, the output signal corresponding to the scan signal supplied from the scan lines connected to the second circuit unit itself, and the power sources and the signals supplied from the first or second wire group.

7. The mother substrate as claimed in claim 5, wherein the second testing/measuring circuit unit is arranged within a distance about 300 μm from a first line for separating the light emitting display devices.

8. The mother substrate as claimed in claim 7, wherein the second testing/measuring unit is arranged between a first scribing line and a second grinding line of the light emitting display devices.

9. The mother substrate as claimed in claim 1, wherein the light emitting display devices further comprise a transistor group having a plurality of transistors connected between first respective ends of the data lines and the predetermined wire included in the first or second wire group.

10. The mother substrate as claimed in claim 9, wherein the transistors provided in the transistor group are turned on at a same time to corresponding to a test control signal supplied from the first or second wire group.

11. The mother substrate as claimed in claim 10, wherein the transistor group outputs a test signal, supplied from the first or second wire group, to the data lines corresponding to the test control signal.

12. The mother substrate as claimed in claim 1, wherein the first wire group or the second wire group is adjacent to at least two of light emitting display devices.

13. The mother substrate as claimed in claim 1, wherein the plurality of light emitting display devices are separated from the mother substrate by a scribing process.

14. The mother substrate as claimed in claim 1, wherein the first testing unit does not affect an operation of the plurality of light emitting display devices after scribing.

15. The mother substrate as claimed in claim 1, wherein the scan signal generated by the scan driver in response to the control signal supplied from the first testing unit is for testing each of the plurality of light emitting display devices.

* * * * *